United States Patent [19]
Koizumi et al.

[11] Patent Number: 5,932,927
[45] Date of Patent: Aug. 3, 1999

[54] HIGH-FREQUENCY DEVICE PACKAGE

[75] Inventors: Takao Koizumi; Yuhei Kosugi, both of Tokyo, Japan

[73] Assignee: NEC Corporation, Tokyo, Japan

[21] Appl. No.: 08/890,975

[22] Filed: Jul. 10, 1997

[30] Foreign Application Priority Data

Jul. 24, 1996 [JP] Japan ................................. 8-194725

[51] Int. Cl.⁶ ........................ H01L 23/34; H01L 23/495
[52] U.S. Cl. ...................... 257/728; 257/688; 257/698; 257/787; 257/674
[58] Field of Search ..................................... 257/688, 690, 257/692, 694, 695, 698, 728, 666, 664, 674, 676, 691, 787; 361/774

[56] References Cited

U.S. PATENT DOCUMENTS

| | | | |
|---|---|---|---|
| 5,182,631 | 1/1993 | Tomimuro et al. | 257/664 |
| 5,519,252 | 5/1996 | Soyano et al. | 257/690 |

FOREIGN PATENT DOCUMENTS

| | | |
|---|---|---|
| 64-17420 | 1/1989 | Japan . |
| 2-105557 | 4/1990 | Japan . |
| 2-125643 | 5/1990 | Japan . |
| 2-260447 | 10/1990 | Japan . |
| 3-161957 | 7/1991 | Japan . |
| 4-348063 | 12/1992 | Japan . |
| 5-109920 | 4/1993 | Japan . |
| 5-152378 | 6/1993 | Japan . |
| 6-112683 | 4/1994 | Japan . |
| 6-164185 | 6/1994 | Japan . |
| 7-221256 | 8/1995 | Japan . |
| 7-297342 | 11/1995 | Japan . |
| 8-167630 | 6/1996 | Japan . |

*Primary Examiner*—Valencia Martin-Wallace
*Assistant Examiner*—George C. Eckert, II
*Attorney, Agent, or Firm*—Young & Thompson

[57] ABSTRACT

A high-frequency device package includes a base, a high-frequency device mounted on the base and having a power supply electrode, a signal electrode, and a ground electrode disposed on a surface thereof, a plurality of leads electrically connected respectively to the power supply electrode, the signal electrode, and the ground electrode using a tape carrier, and a resin body sealingly encasing the high-frequency device. The resin body is formed by dropping a molten resin mass onto the base in covering relation to the high-frequency device and thereafter solidifying the dropped resin mass to sealingly encase the high-frequency device.

6 Claims, 6 Drawing Sheets

HIGH-FREQUENCY DEVICE PACKAGE

BACKGROUND OF THE INVENTION

1. Field of the Invention

The present invention relates to a package encasing a high-frequency device such as an MIC (Microwave Integrated Circuit) or an MMIC (Microwave Monolithic Integrated Circuit).

2. Description of the Related Art

FIG. 1 of the accompanying drawings shows in perspective a conventional high-frequency device package which encases an MIC therein.

As shown in FIG. 1, the high-frequency device package includes a base 102 on which an MIC 101 and film circuit boards 116 are soldered. Each of the film circuit boards 116 comprises an adjustment circuit, a filter circuit, a balun circuit, etc. formed on a ceramic board by the thin film technology. Chip capacitors 103 are also mounted on the base 102.

Power supply terminals 104 and signal terminals 115 for connection to circuits external to the high-frequency device package extend transversely through the base 102 in hermetically sealed relation thereto. The power supply terminals 104 are electrically connected to the chip capacitors 103, respectively, by bonding wires 117, and the chip capacitors 103 are electrically connected to the film circuit boards 116 by bonding wires 117. The film circuit boards 116 are electrically connected to the MIC 101 by bonding wires 117. The signal terminals 115 are electrically connected to the film circuit boards 116 by bonding wires 117. Therefore, electric energy from an external power supply (not shown) and input signals from an external circuit are supplied through the terminals 104, 115 to the MIC 101. Output signals processed in the high-frequency device package are also led through the terminals 115 to the external circuit. Since the power supply terminals 104 and the MIC 101 are connected to each other through the chip capacitors 103, high-frequency signals are prevented from leaking out of the high-frequency device package through the power supply terminals 104.

The surface of the base 102 on which the MIC 101 and other components are mounted is hermetically sealed by a cap 106 to protect the MIC 101 and other components from humidity and dust. The cap 106 is made of metal such that it electrically shields the MIC 101 and other components. The cap 106 may be brazed or welded to the base 102 to hermetically seal the MIC 101 and other components on the base 102.

Many electronic devices which incorporate high-frequency devices such as MICs are available for personal use, and there are demands for making those electronic devices less expensive. However, conventional high-frequency device packages have suffered various difficulties that prevent their cost from being reduced, as described below.

First, since the components in the high-frequency device packages are electrically connected by bonding wires, each electrode or contact has to be connected by an individual bonding wire. As a result, the number of required bonding steps is very large.

Secondly, the components on the base of the high-frequency device packages need to be hermetically sealed by the cap in a nitrogen atmosphere with high positional accuracy. Such a sealing process must be carried out by a special piece of equipment.

SUMMARY OF THE INVENTION

It is an object of the present invention to provide a high-frequency device package which allows components thereof to be easily electrically connected and permits itself to be hermetically sealed with ease, and that can easily be manufactured.

To achieve the above object, there is provided in accordance with the present invention a high-frequency device package comprising a base, a high-frequency device mounted on the base and having a power supply electrode, a signal electrode, and a ground electrode disposed on a surface thereof, a plurality of leads electrically connected respectively to the power supply electrode, the signal electrode, and the ground electrode using a tape carrier, and a resin body which sealingly encases the high-frequency device.

The leads may be electrically connected to the power supply electrode, the signal electrode, and the ground electrode by thermocompression bonding. The power supply electrode, the signal electrode, and the ground electrode may comprise protruding electrodes, respectively.

The high-frequency device package may further include a capacitor mounted on the base closely to the power supply electrode and having an electrode on a surface thereof, the electrode of the capacitor being electrically connected to the lead electrically connected to the power supply electrode, the capacitor and the high-frequency device being encased by the resin body.

The resin body may have a surface coated with an electrically conductive material.

The leads which are electrically connected to the power supply electrode, the signal electrode, and the ground electrode may be jointly of a coplanar lead structure.

The lead which is electrically connected to the signal electrode and the lead which is electrically connected to the ground electrode may be disposed adjacent to each other and held together by an insulating protective member.

Since the electrodes of the high-frequency device and the leads are joined to each other using the tape carrier, the electrodes and the leads can simultaneously be joined to each other. Consequently, the step of joining the electrodes and the leads to each other and the step of sealingly encasing the high-frequency device are facilitated, resulting in a reduction in the cost of the high-frequency device package.

If the capacitor is positioned near the power supply electrode for the purpose of cutting off high-frequency signals which act as noise on external circuits, then the power supply electrode and the capacitor may be connected by the same lead as the lead which connects the power supply electrode to an external power supply.

The lead connected to the signal electrode and the lead connected to the ground electrode are held in a coplanar configuration which allows signals to be transmitted therethrough with good transmission characteristics. The lead connected to the signal electrode and the lead connected to the ground electrode are held together by an insulating protective sheath for preventing their impedances from being varied.

The above and other objects, features, and advantages of the present invention will become apparent from the following description with references to the accompanying drawings which illustrate an example of the present invention.

DETAILED DESCRIPTION OF THE PREFERRED EMBODIMENT

Figure 1:
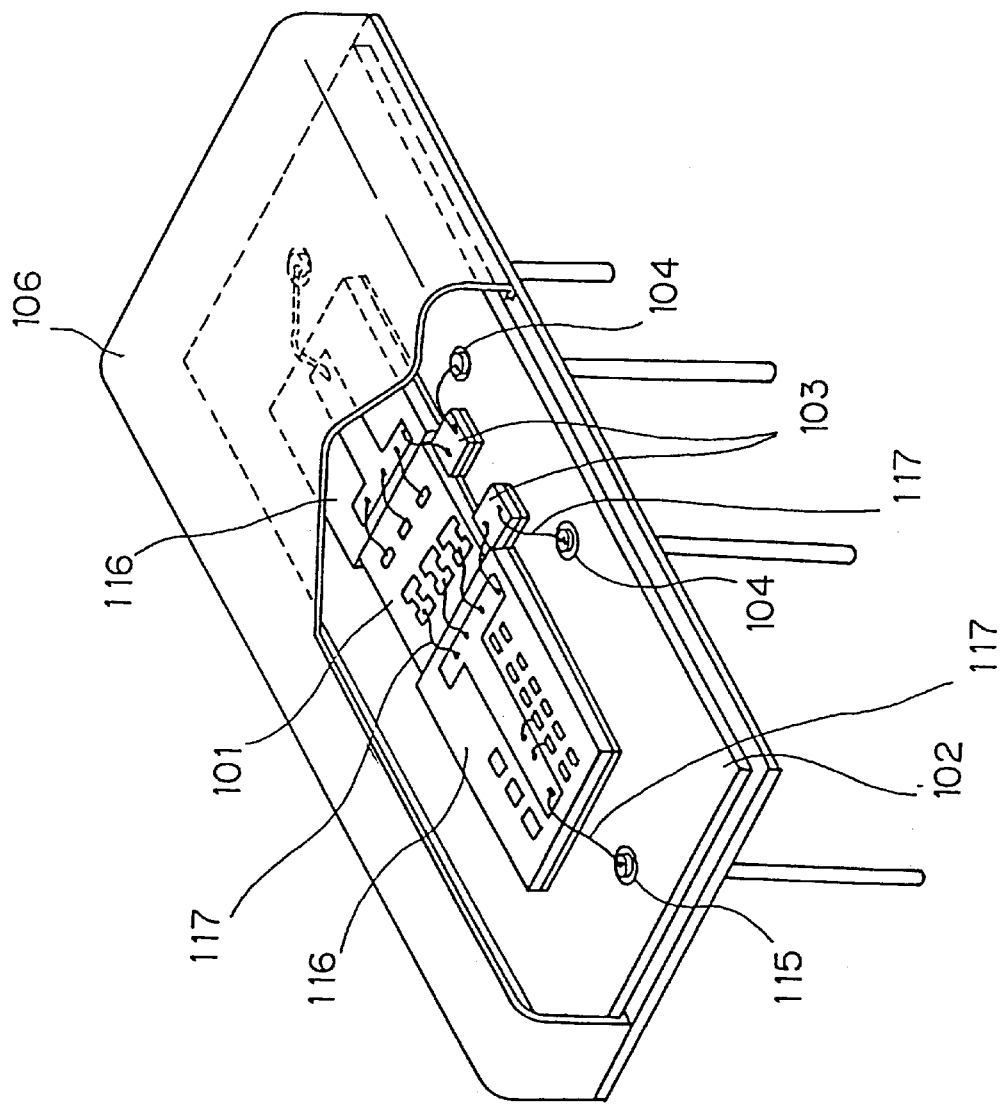
FIG. 1 is a perspective view, partly cut away, of a conventional high-frequency device package.
Figure 2:
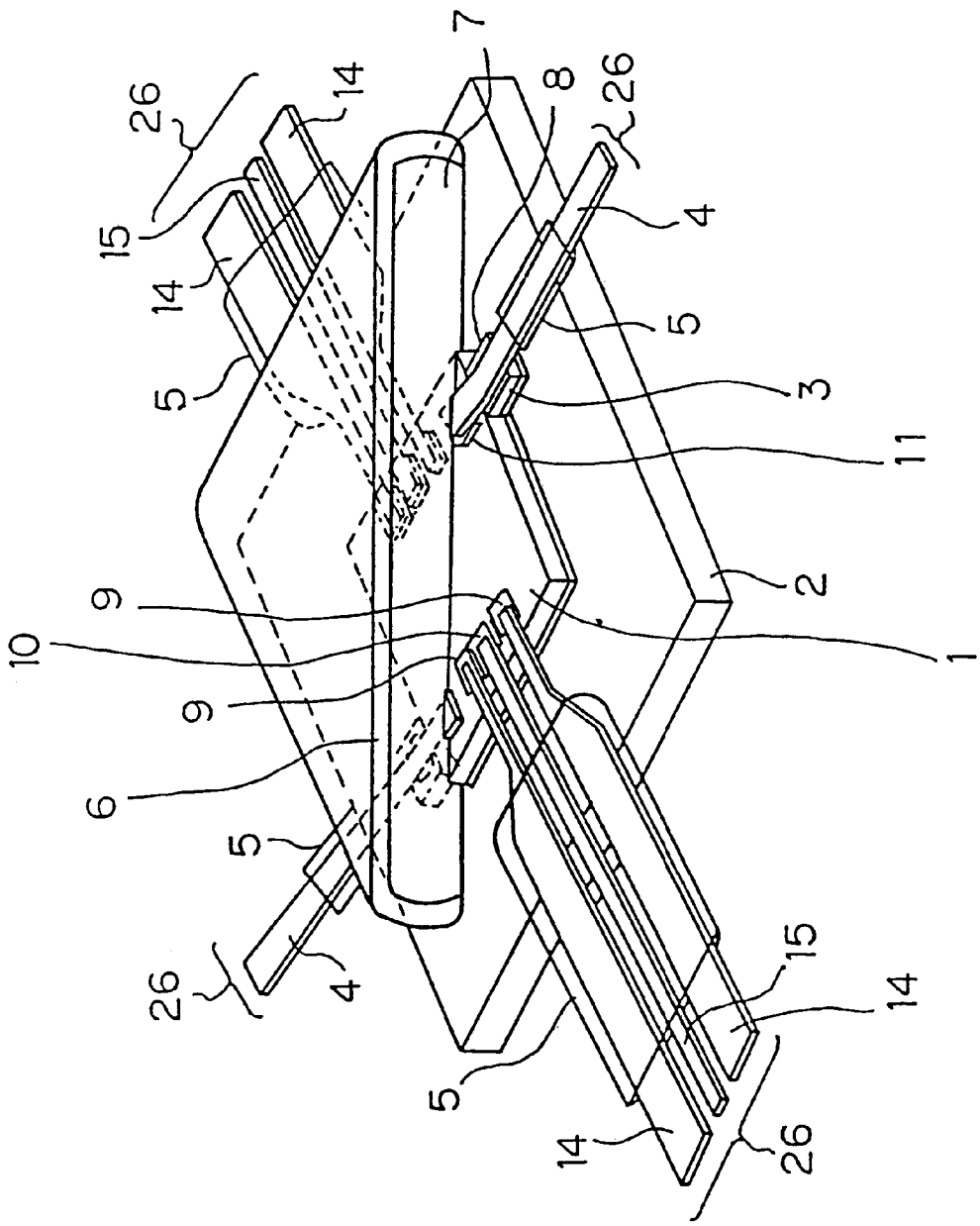
FIG. 2 is a perspective view, partly cut away, of a high-frequency device package according to the present invention.

As shown in FIG. 2, a high-frequency device package according to the present invention has an MIC 1, which is a high-frequency device, mounted on a base 2 by solder or an electrically conductive adhesive. The base 2 is made of tungsten copper and has a coefficient of thermal expansion which is substantially the same as that of the MIC 1 that is primarily made of GaAs. Therefore, when the MIC 1 is heated due to operation of its own and hence the base 2 is heated thereby, any stresses imposed on the MIC 1 owing to the difference between the rates of thermal expansion of the MIC 1 and the base 2 are minimized.

The base 2 has a good thermal conductivity as it provides a heat radiation body for the MIC 1 as well as a support of the MIC 1. While the base 2 is made of tungsten copper in the illustrated embodiment, the base 2 may be made of aluminum nitride or any of various other materials insofar as it has a coefficient of thermal expansion which is substantially the same as that of the MIC 1 and also a good thermal conductivity. The base 2 has an outer profile that is several millimeters greater than the MIC 1, and has a thickness ranging from 0.3 to 1 mm.

Figure 3:
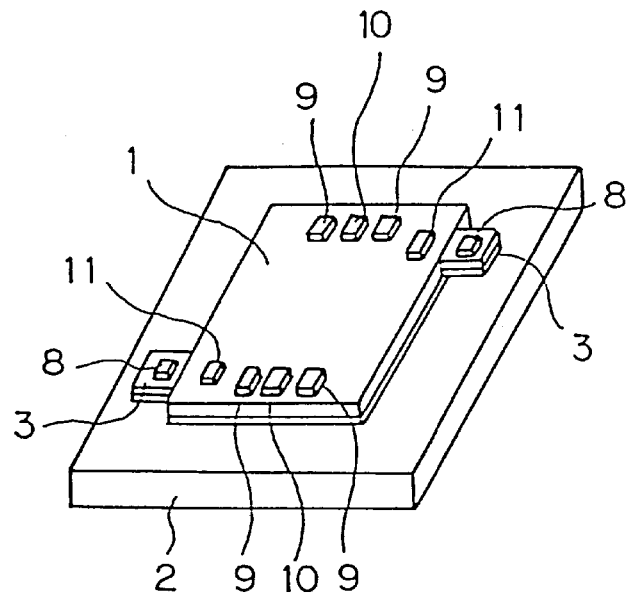
FIG. 3 is a perspective view of a base and components thereon of the high-frequency device package shown in FIG. 2, prior to connection of leads thereto.

As shown in FIG. 3, the MIC 1 has on its upper surface two arrays of ground electrodes 9, signal electrodes 10, and power supply electrodes 11 as upwardly projecting electrodes. In each of the electrode arrays, the ground electrodes 9 are positioned one on each side of the signal electrode 10. Chip capacitors 3 of ceramics are mounted on the base 2 by solder or an electrically conductive adhesive at positions near the respective power supply electrodes 11 of the electrode arrays. Upwardly projecting electrodes 8 are disposed on respective upper surfaces of the chip capacitors 3.

Referring back to FIG. 2, ground leads 14 are electrically connected to the ground electrodes 9, respectively, and signal leads 15 are electrically connected to the signal electrodes 10. Power supply leads 4 are electrically connected to the respective power supply electrodes 11 and the respective electrodes 8 on the chip capacitors 3. As described later on, these leads are electrically joined simultaneously to the electrodes by thermocompression bonding.

Figure 4:
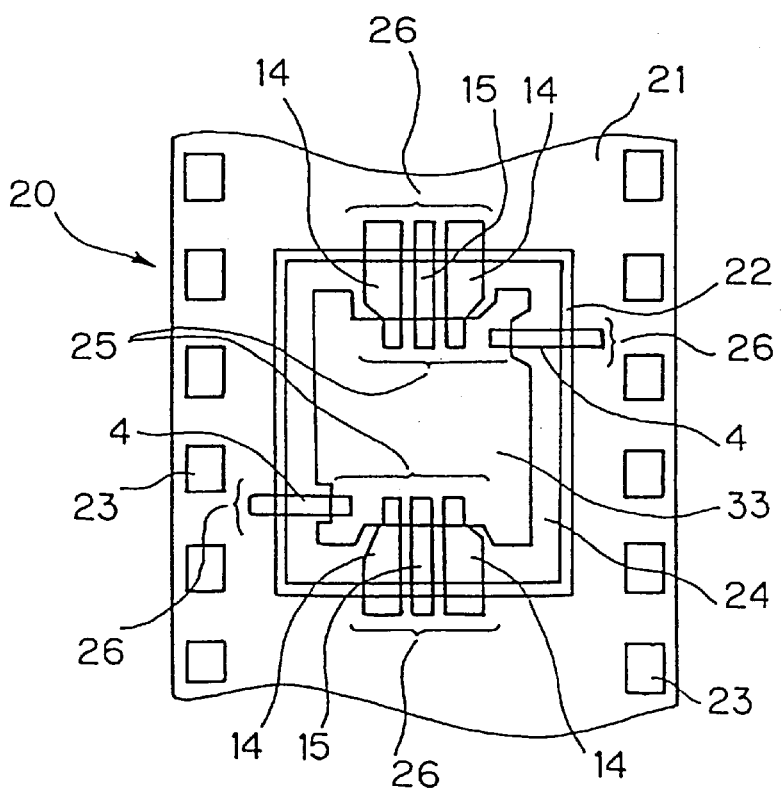
FIG. 4 is a fragmentary plan view of a tape carrier for forming leads of the high-frequency device package shown in FIG. 2.

The ground leads 14, the signal leads 15, and the power supply leads 4 are cut off from a tape carrier 20 shown in FIG. 4. As shown in FIG. 4, the tape carrier 20 comprises a plastic tape 21 made of polyimide as a base material and carrying ground leads 14, signal leads 15, and power supply leads 4 which are formed of an electric conductor such as copper or the like by plating and etching processes. The plastic tape 21 has a device hole 33 defined therein with inner leads 25 projecting therein, an outer lead hole 22 defined therein around the device hole 33 with outer leads 26 projecting therein, and sprocket holes 23 defined therein for being engaged by sprocket wheels for automatically feeding the tape carrier 20. The inner leads 25 comprise inner ends of the leads 14, 15, 4, and the outer leads 26 comprise outer ends of the leads 14, 15, 4.

The tape carrier 20 also has a support ring 24 of polyimide disposed in the outer lead hole 22 and covering the ground leads 14, the signal leads 15, and the power supply leads 4 except for the inner leads 25 which will be connected to the electrodes and the outer leads 26 which will be connected to external circuits.

The inner leads 25 are electrically joined simultaneously to the leads 14, 15, 4 by thermocompression bonding. Thereafter, as shown in FIG. 2, the ground leads 14, the signal leads 15, and the power supply leads 4 are cut off at the outer leads 26 thereof. The ground leads 14 and the signal leads 15 comprise coplanar leads lying in a common plane, and have an impedance of 50 Ω. The coplanar structure of the ground leads 14 and the signal leads 15 and the improved impedance of these leads as input/output interfaces allow signals to be transmitted therethrough with good transmission characteristics. Such coplanar and impedance configurations can be achieved by fabricating the leads using the tape carrier 20.

The support ring 24 is also cut off except for the portions that cover the ground leads 14, the signal leads 15, and the power supply leads 4. The remaining portions of the support ring 24 serve as insulating protective sheaths 5 as shown in FIG. 2. Particularly, the ground leads 14 and the signal leads 15 are held together by the protective sheaths 5 against mechanical positional displacements relative to each other and hence against deviations from the designed impedance.

The MIC 1 to which the ground leads 14, the signal leads 15, and the power supply leads 4 are electrically connected, and the chip capacitors 3 are then encased by a body 7 of a synthetic resin such as silicone resin, epoxy resin, or the like. In an encasing process, a flowable mass of a synthetic resin is dropped onto the base 2 in covering relation to the MIC 1 and the chip capacitors 3. After the MIC 1 and the chip capacitors 3 are covered with the resin mass, the resin mass is solidified in a manner depending on its property. For example, if the resin mass comprises a thermosetting resin, then it is heated into the resin body 7. The MIC 1 and the chip capacitors 3 covered with the resin body 7 are hermetically sealed thereby for protection against humidity and dust.

If the MIC 1 and the chip capacitors 3 need to be electrically sealed, then the surface of the resin body 7 is coated with an electrically conductive adhesive 6. The ground leads 14, the signal leads 15, and the power supply leads 4 are not short-circuited by the electrically conductive adhesive 6 because they are covered with the protective sheaths 5.

Figure 5:
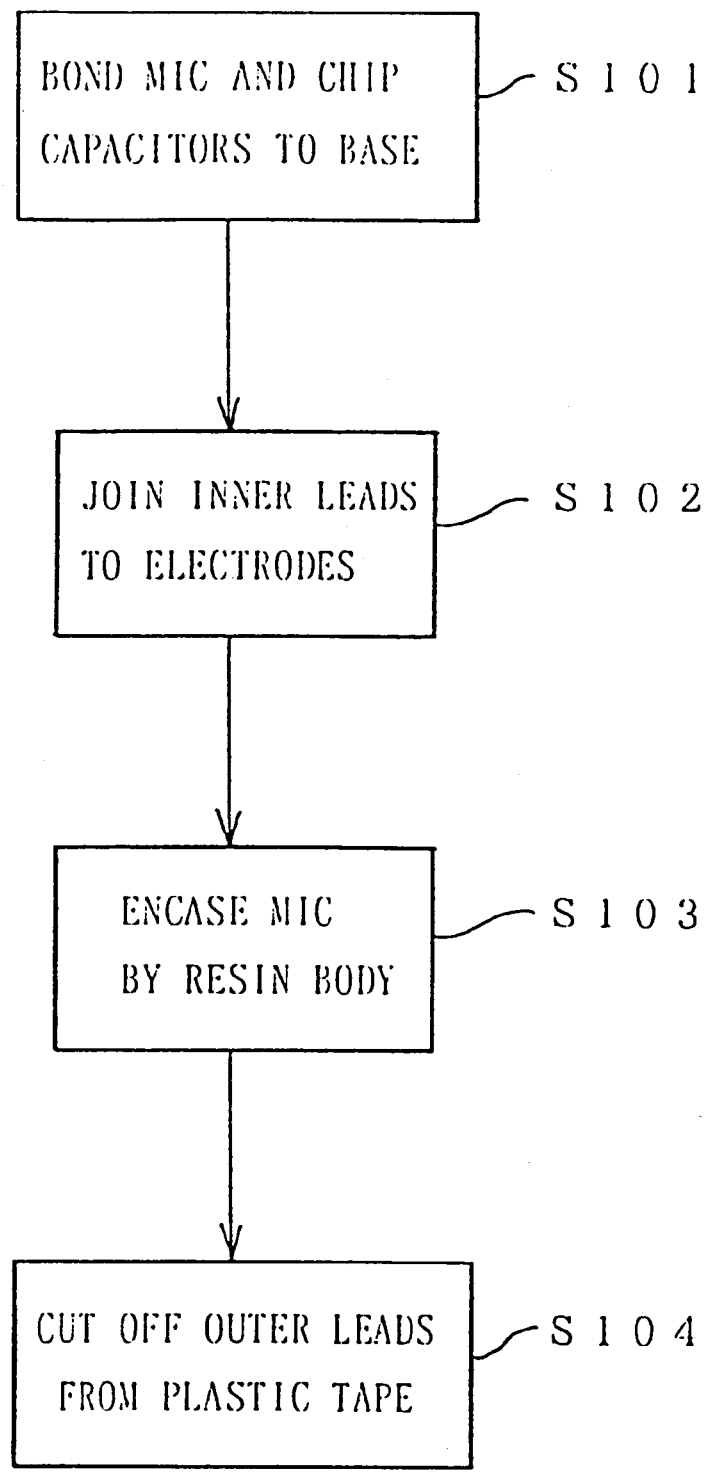
FIG. 5 is a flowchart of a fabrication process for the high-frequency device package shown in FIG. 2.

A process of fabricating the high-frequency device package shown in FIG. 2 will be described below with reference to FIG. 5.

The MIC 1 and the chip capacitors 3 are bonded to the base 2 in a step S101. Protrusions are formed in advance by bonding wires on the MIC 1 and the chip capacitors 3 and used as the electrodes 9, 10, 11, 8. These electrodes 9, 10, 11, 8 are thus projecting upwardly on the MIC 1 and the chip capacitors 3.

The inner leads 25 on the tape carrier 20 are then joined to the electrodes 8, 9, 10, 11 by thermocompression bonding, so that they are electrically interconnected, in a step S102.

Figure 6:
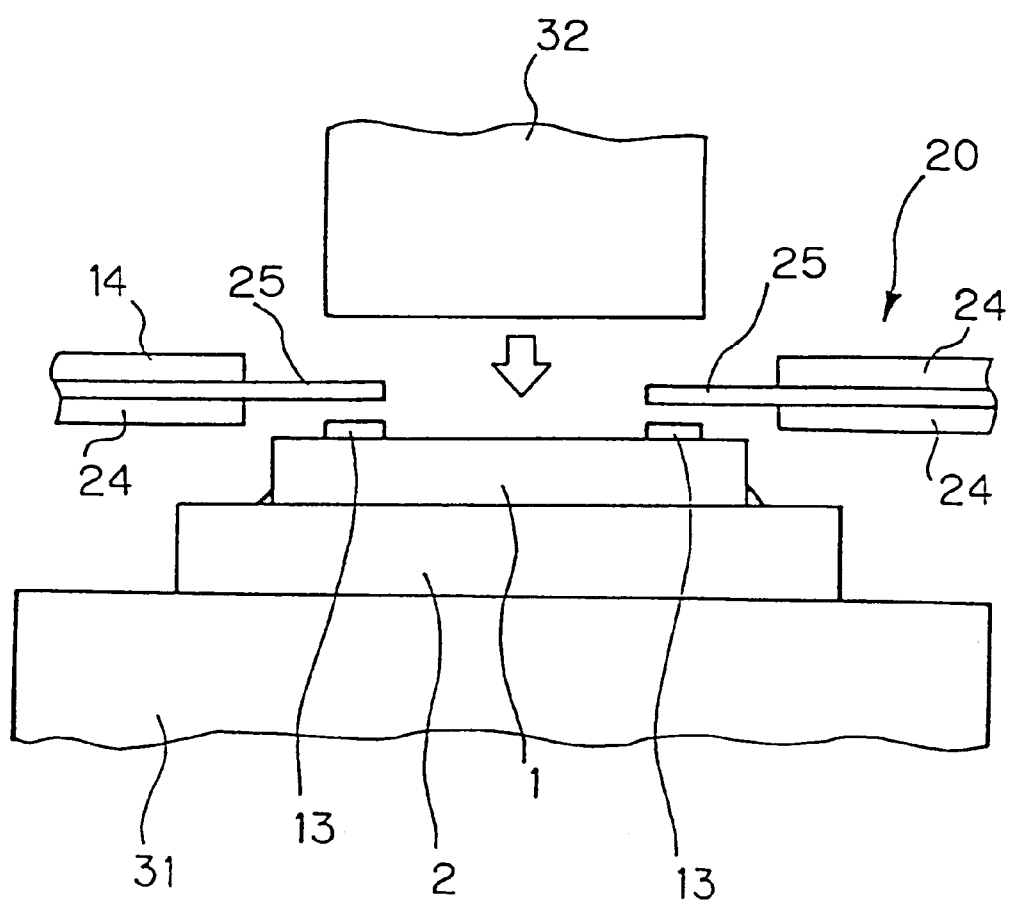
FIG. 6 is a fragmentary elevational view illustrative of the manner in which electrodes of an MIC and leads are connected.

The thermocompression bonding process in the step S102 will be described below with reference to FIG. 6. The electrodes 8, 9, 10, 11 will be collectively referred to as electrodes 13.

The base 2 on which the MIC 1 and the chip capacitors 3 (not shown in FIG. 6) are mounted is placed on a hot plate 31 which is heated. The inner leads 25 on the tape carrier 20 are positioned on the respective electrodes 13 in alignment therewith, and a bonding tool 32 which is heated is pressed downwardly against the inner leads 25 for thereby bonding the inner leads simultaneously to the electrodes 13. Therefore, the electrodes 13 and the inner leads 25 can easily be bonded to each other. Since the electrodes 13 project upwardly, the inner leads 25 can easily be bonded to the electrodes 13 with increased reliability. Because the base 2 is heated by the hot plate 31, the temperature of the bonding tool 32 may be relatively low, so that the inner leads 25 can reliably be bonded to the electrodes 13.

After the thermocompression bonding process, a molten resin mass 7 is dropped onto the base 2 in covering relation to the MIC 1. In the illustrated embodiment, the resin mass 7 comprises a thermosetting resin, and is thermoset into the resin body 7 at a temperature ranging from 100 to 160° C., thus sealingly encasing the MIC 1 in a step S103. If necessary, the surface of the resin body 7 is coated with the electrically conductive adhesive 6. The MIC 1 may be encased by the resin body 7 and coated with the electrically conductive adhesive 6 in an ordinary atmosphere. A plurality of MICs 1 may be encased and coated in a batch processing operation. Therefore, the MIC 1 can be encased and coated easily and efficiently.

Figure 7:
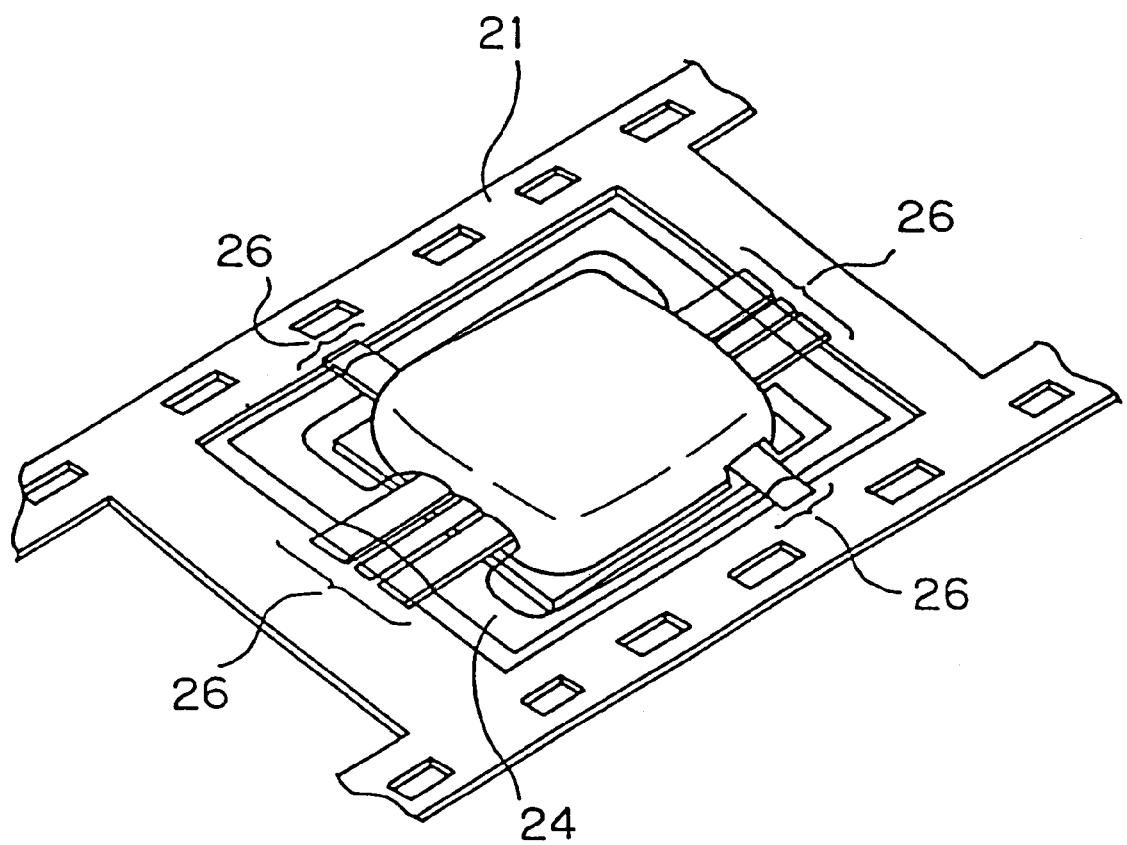
FIG. 7 is a fragmentary perspective view of the high-frequency device package with the MIC encased by a resin body, prior to the leads being cut off.

The encased MIC 1 is shown in FIG. 7. As shown in FIG. 7, the plastic tape 21 and the encased MIC 1 are integrally joined to each other at this stage.

Finally, the outer leads 26 are cut off from the plastic tape 21, and unnecessary portions of the support ring 24 are removed in a step S104, thus completing the high-frequency device package shown in FIG. 2.

As described above, the electrodes of the high-frequency device and the leads are joined to each other using the tape carrier. Therefore, the electrodes and the leads can simultaneously be joined to each other. Since the high-frequency device is sealingly encased by the dropped resin mass, no special facility or process is required for encasing the high-frequency device, and the high-frequency device can efficiently be encased. Consequently, the step of joining the electrodes and the leads to each other and the step of sealingly encasing the high-frequency device are facilitated, resulting in a reduction in the cost of the high-frequency device package.

If the chip capacitors are positioned near the power supply electrodes for the purpose of cutting off high-frequency signals which act as noise on external circuits, then the power supply electrodes and the chip capacitors may be connected by the same leads as the leads which connect the power supply electrodes to an external power supply.

The leads connected to the signal electrodes and the leads connected to the ground electrodes are held in a coplanar configuration which allows signals to be transmitted therethrough with good transmission characteristics. The leads connected to the signal electrodes and the leads connected to the ground electrodes are held together by insulating protective sheaths for preventing their impedances from being varied.

It is to be understood that variations and modifications of the cross-connection devices disclosed herein will be evident to those skilled in the art. It is intended that all such modifications and variations be included within the scope of the appended claims.

What is claimed is:

1. A packaged high frequency device, comprising:

a base;

a high frequency device mounted on said base, said device comprising a power supply electrode, a signal electrode, and a ground electrode;

power supply, signal, and ground leads connected to respective ones of said power supply, signal, and ground electrodes, said leads extending outwardly from said device across said base;

an electrically insulative and mechanically supportive sheath surrounding portions of said leads which extend across said base, said sheath comprising separate spaced apart sections which separately encase said power supply lead and at least an adjacent pair of said ground and signal leads; and a resin sealingly covering said device and portions of said leads, said sheath in which said leads are encased having an interior portion covered by said resin and an exterior portion outside of said resin from which said leads extend.

2. The packaged high-frequency device according to claim 1, wherein said leads are electrically connected to said power supply electrode, said signal electrode, and said ground electrode by thermocompression bonding.

3. The packaged high-frequency device according to claim 1, further comprising a capacitor mounted on said base close to said power supply electrode and having an electrode on a surface thereof, said electrode of said capacitor being electrically connected to said power supply lead, said capacitor and said high-frequency device being encased by said resin.

4. The packaged high frequency device of claim 1, further comprising an electrically conductive covering on said resin, said exterior portion of said sheath electrically isolating said leads outside of said resin from said electrically conductive covering.

5. The packaged high frequency device of claim 1, wherein all of said leads are coplanar.

6. A tape carrier for a packaged high frequency device, comprising:

a plastic tape having a device hole therein for receiving a high frequency device;

a support ring spaced from said plastic tape around an interior perimeter of said device hole, said support ring being electrically insulative and mechanically supportive; and power supply, signal, and ground leads extending from inside said device hole, through said support ring, and onto said plastic tape, wherein said support ring completely surrounds portions of said leads extending through said support ring to electrically insulate the surrounded portions and to mechanically support and hold the surrounded portions of each of said leads in a fixed position relative to the surrounded portions of other said leads.

* * * * *